United States Patent
Lin et al.

(10) Patent No.: US 7,542,531 B2
(45) Date of Patent: Jun. 2, 2009

(54) DIGITAL CANCELLATION OF RADIO FREQUENCY INTERFERENCE

(75) Inventors: Chia-Liang Lin, Union City, CA (US); Pei-Chieh Hsiao, Hsinchu (TW)

(73) Assignee: Realtek Semiconductor Corp. (TW)

( * ) Notice: Subject to any disclaimer, the term of this patent is extended or adjusted under 35 U.S.C. 154(b) by 657 days.

(21) Appl. No.: 11/196,914

(22) Filed: Aug. 4, 2005

(65) Prior Publication Data

US 2006/0215775 A1     Sep. 28, 2006

Related U.S. Application Data

(60) Provisional application No. 60/594,265, filed on Mar. 24, 2005.

(51) Int. Cl.
*H03D 1/04* (2006.01)

(52) U.S. Cl. .................. 375/346; 375/316; 375/295; 375/219; 370/210; 329/318; 329/349; 708/400

(58) Field of Classification Search .............. 375/346, 375/316, 295, 219; 370/210; 329/318, 349; 708/400

See application file for complete search history.

(56) References Cited

U.S. PATENT DOCUMENTS 5,995,567 A * 11/1999 Cioffi et al. .................. 375/346
6,014,412 A * 1/2000 Wiese et al. .................. 375/346
6,035,000 A    3/2000 Bingham
6,738,440 B1 * 5/2004 Isaksson et al. .............. 375/349
2001/0028692 A1 * 10/2001 Wiese et al. .................. 375/296
2003/0223518 A1 * 12/2003 Shmulyian et al. .......... 375/346
2006/0215775 A1 *  9/2006 Lin et al. ...................... 375/260

* cited by examiner

*Primary Examiner*—David C Payne
*Assistant Examiner*—Zewdu Kassa
(74) *Attorney, Agent, or Firm*—Schwegman, Lundberg & Woessner, P.A.

(57) ABSTRACT

A method and system of canceling radio frequency interference (RFI) sourced from a narrow-band radio frequency transmitter to interfere with the operation of a multi-carrier modulation system. The spectral components of the RFI can be represented as a Taylor series of $1/(m-\frac{1}{2})$ where m is an integer and $(m-\frac{1}{2})$ is a normalized approximate distance between the frequency of interest and the center frequency of the RFI. The coefficients of the Taylor series are obtained by solving a set of linear equations using the Fourier output at several properly chosen frequencies where the REI components dominate. The coefficients for the Taylor series are formulated as linear combinations of the FFT output at the chosen frequencies and are computed and stored beforehand. Simple multiplications and additions are needed for obtaining the Taylor series coefficients from the FFT output at the chosen frequencies. The coefficients of the Taylor series can be obtained for any frequency, and the spectral component of the RFI can be estimated and removed from the MCM signals.

20 Claims, 7 Drawing Sheets

-PRIOR ART-

*FIG. 1*

-PRIOR ART-

*FIG. 2A*

-PRIOR ART-

*FIG. 2B*

-PRIOR ART-

*FIG. 3A*

-PRIOR ART-

*FIG. 3B*

−PRIOR ART−

*FIG. 4*

−PRIOR ART−

*FIG. 5*

-PRIOR ART-

FIG. 6

-PRIOR ART-

DIGITAL CANCELLATION OF RADIO FREQUENCY INTERFERENCE

CROSS-REFERENCE TO RELATED PATENT APPLICATION

This patent application claims the benefit under Title 35, United States Code, section 119(e), of U.S. Provisional Patent Application Ser. No. 60/594,265 filed Mar. 24, 2005 and entitled "Digital Radio Frequency Interference Canceller for Multi-carrier Modulation Receiver," by inventors Chia-Liang Lin and Pei-chieh Hsiao, the entire subject matter of which is incorporated herein by reference.

COPYRIGHT NOTICE

This patent document contains copyrightable subject matter that may include (by way of example and not by way of limitation) computer software elements, source code, flow charts, screen displays, and other copyrightable subject matter. The following notice shall apply to these elements: Copyright (© 2005 Real Communications, Inc., San Jose, CA. All rights reserved.

LIMITED WAIVER OF COPYRIGHT

In accordance with 37 CFR section 1.71(e), a portion of the disclosure of this patent document may contain material to which a claim for copyright is made. The copyright owner has no objection to the facsimile reproduction by anyone of the patent document or the patent disclosure as it appears in the United States Patent and Trademark Office patent file or records, as long as the above Copyright Notice remains legible on all copies. The copyright owner reserves all other national and international copyright rights.

BACKGROUND OF THE INVENTION

1. Field of the Invention

The present invention relates to radio frequency interference (RFI) cancellation and in particular to an RFI canceller in a multi-carrier modulation receiver.

2. Description of the Related Art

A multi-carrier modulation (MCM) system utilizes a superposition of a plurality of tones (or sub-carriers) to transmit information. Each tone carries a certain bit-load of information using a certain modulation technique such as quadrature amplitude modulation (QAM), by way of example and not by limitation. Other modulation systems can be used for each tone such as Carrierless Amplitude and Phase modulation (CAP), Quadrature Phase Shift Keying (QPSK), vestigial sideband modulation, etc. For instance, if 16-QAM is used for a particular tone, it allows 16 different combinations in the amplitude and phase for this tone and therefore enables this tone to carry 4-bits of information. All tones in a MCM system are orthogonal to one another and therefore each can be separated and detected, and the respective certain bit-load of information can be retrieved by the remote receiver on a per-tone basis.

Figure 1:
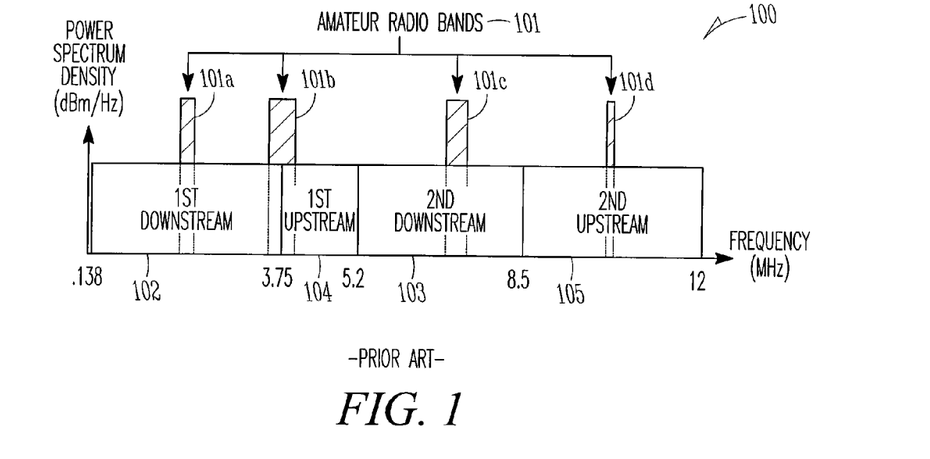
FIG. 1 illustrates a prior art diagram of the North America VDSL frequency plan with overlapping amateur radio bands.

The present description uses VDSL (very high speed digital subscriber line) to demonstrate embodiments of the present invention, although this invention has many embodiments and is applicable to a general MCM system and other modulation systems. VDSL is a standard of using MCM to transmit high-speed data over unshielded twisted pair of telephone lines. VDSL defines a bi-directional data transmission between a line termination (LT) unit and a network termination (NT) unit using the same twisted pair of telephone lines. The data traffic from LT to NT is called "downstream" while the data traffic from NT to LT is called "upstream." VDSL utilizes frequency domain duplex (FDD) to allow simultaneous transmission of upstream and downstream data. The standard available frequency band (from 138 KHz to 12 MHz) is divided into two upstream sub-bands and two downstream sub-bands as shown in FIG. 1. Upstream traffic utilizes tones whose frequencies fall within the two upstream sub-bands 104, 105, while downstream traffic utilizes tones whose frequencies fall within the two downstream sub-bands 102, 103. The frequency of every tone used in either upstream or downstream traffic must be an integer multiple of the tone spacing $\Delta f = 4.3125$ KHz. Therefore, downstream tones are orthogonal to upstream tones and they can be detected separately. This allows a simultaneous transmission of downstream and upstream traffic over the same twisted pair of telephone lines.

However, the VDSL system shares its frequency band with different types of radio transmissions. In particular, and for example, VDSL is subject to narrowband radio frequency interference (RFI) that is generated by an amateur radio transmitter and picked up by the unshielded twisted pair of telephone lines. FIG. 1 shows the North America VDSL frequency plan 100 with the overlapping of the amateur radio bands 101a, 101b, 101c and 101d. To ensure a reliable data transmission, VDSL system usually avoids using the tones whose frequencies fall into the amateur radio bands, generally identified as 101 in FIG. 1. This would prevent the RFI from interfering with the VDSL data transmission if the RFI is orthogonal to the tones used in VDSL transmission.

Figure 2A:
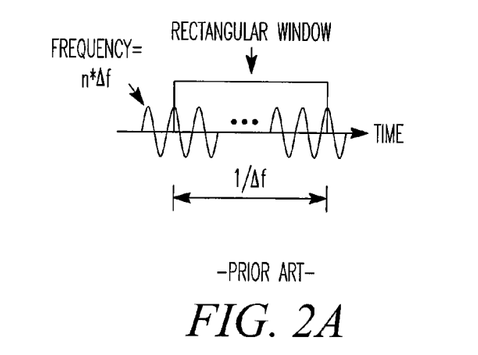
FIG. 2A illustrates a prior art time domain plot of a pure sinusoidal signal that is orthogonal to the tones used by a MCM system.
Figure 2B:
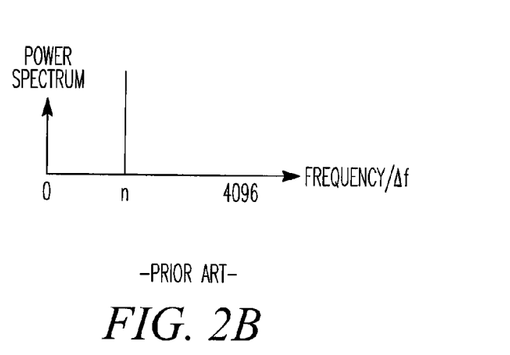
FIG. 2B illustrates a prior art frequency domain plot of the pure sinusoidal signal of FIG. 2A.
Figure 3A:
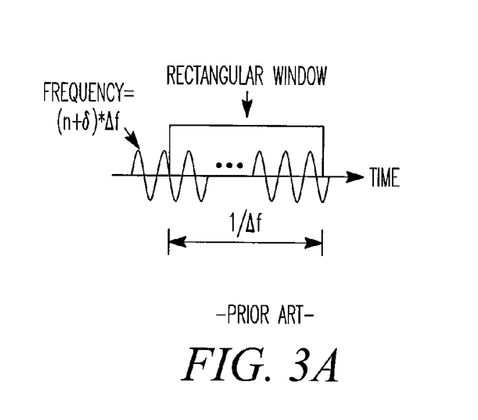
FIG. 3A illustrates a prior art time domain plot of a sinusoidal signal that is not orthogonal to the tones used by the MCM system.
Figure 3B:
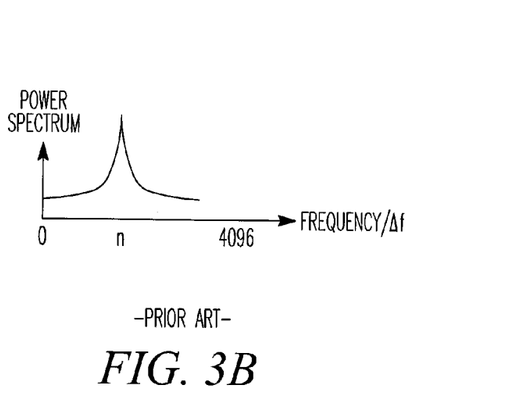
FIG. 3B illustrates a prior art frequency domain plot of the sinusoidal signal of FIG. 3A.

Note that "orthogonality" holds only if the RFI is purely sinusoidal as shown in the conceptual time domain plot in FIG. 2A and its frequency is an exact integer multiple of the tone spacing $\Delta f = 4.3125$ KHz, i.e., $f_{RFI} = n \times 4.3125$ KHz, where n is an integer. FIG. 2A shows a conceptual time domain plot of a pure sinusoid. In this example, the power spectrum, obtained from an 8192-point FFT (Fast Fourier Transform) using a rectangular window of time span of $1/\Delta f$, will be a delta function at n, as shown in FIG. 2B. The orthogonality fails if the RFI is purely sinusoidal but in the case of RFI from amateur radio, the frequency is not an exact integer multiple of the tone spacing $\Delta f = 4.3125$ KHz, i.e., $f_{RFI} = (n+\delta) \times \Delta f$, where n is a integer and $0 < \delta < 1$. In this real-world example of an amateur-radio modulated carrier shown in FIG. 3A as a time domain plot, the power spectrum will exhibit side-lobes as shown in the frequency domain plot of FIG. 3B. In any case, if the RFI is a modulated carrier using, for example, amplitude modulation (AM), the power spectrum will always exhibit side-lobes, regardless of the carrier frequency. Whenever side-lobes exist, the RFI spills widely over the frequency spectrum and disrupts the orthogonal tones used by upstream or downstream traffic and degrades the quality of transmission.

Figure 4:
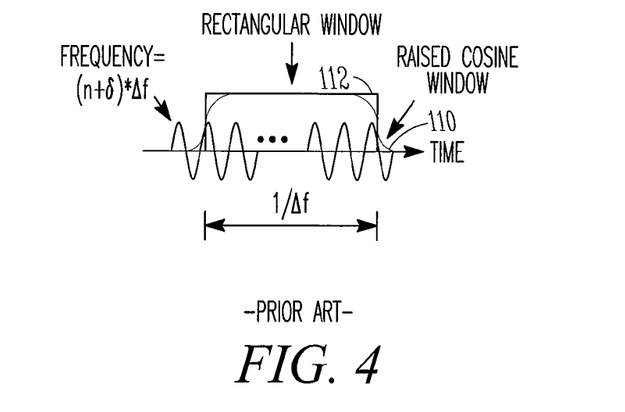
FIG. 4 illustrates various prior art windowing techniques to mitigate RFI degradation of system performance due to the side-lobes of RFI.
Figure 5:
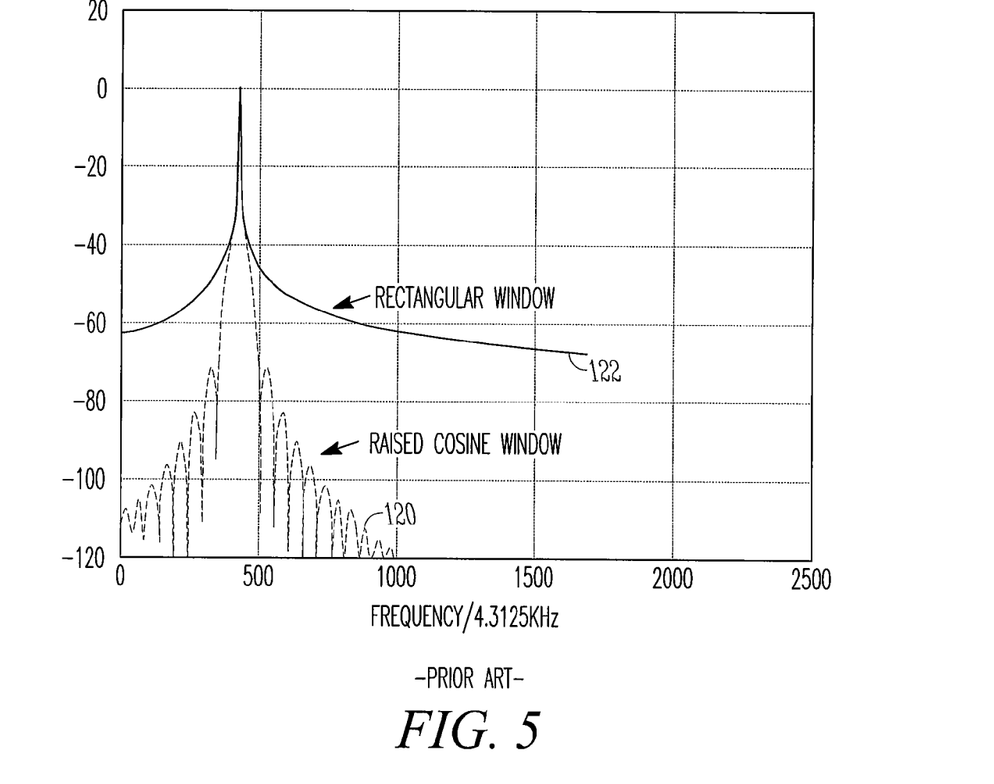
FIG. 5 illustrates various prior art frequency domain plots of the windowed signals of FIG. 4.

FIG. 4 shows one way to mitigate the degradation of system performance due to the side-lobes of RFI is to use a better window when performing FFT. For example, a "raised-cosine" window 110 can be applied instead of a rectangular window 112. In contrast with a rectangular window, which has abrupt transitions near both edges, a non-rectangular window such as the "raised-cosine" window has graceful, smooth transition near both edges. To make that smooth transition, a non-rectangular window needs to be wider than a rectangular window, as shown in FIG. 4. On the other hand, the number of points of the FFT needs to be the same for both windows. Therefore, a "folding" operation needs to be performed when using a non-rectangular window. For example, if we use 8192-points FFT, the rectangular window will cover 8192 time-domain samples, labeled $x_0, x_1, x_2, \ldots, x_{8191}$. If we use a "raised cosine" window that extends 64 samples beyond both edges of the rectangular window, we have a total of 8320 samples (8192+(2×64)), labeled $y_{-64}, y_{-63}, y_{-62}, \ldots, y_{8255}$. The windowing operation multiplies each of the (8192+(2×64)) samples with a respective, pre-defined value. Then we need to fold the last 64 samples, i.e. $y_{8192}, y_{8193}, \ldots, y_{8255}$, by removing these samples but adding their values to the first 64 samples of the corresponding rectangular window, i.e. samples $y_0, y_1, y_2, \ldots, y_{63}$, respectively. Likewise, we need to fold the first 64 samples, i.e. $y_{-64}, y_{-63}, \ldots, y_{-1}$, by removing these samples but adding their values to the last 64 samples of the corresponding rectangular window, i.e. samples $y_{8128}, y_{8129}, \ldots, y_{8191}$, respectively. Or, preferably, we may simply use one "folding" operation by removing the first (or last) 2×64 samples, i.e. $y_{-64}, y_{-63}, \ldots, y_{63}$ (or $y_{8128}, y_{8129}, \ldots, y_{8255}$), but adding their values to the last (or first) 2×64 samples of the non-rectangular window, i.e. $y_{8128}, y_{8129}, \ldots, y_{8255}$ (or $y_{-64}, y_{-63}, \ldots, y_{63}$), respectively. The power spectrum of RFI of frequency 424.35×Δf using a rectangular window 122, along with the spectrum of the same RFI using a raised cosine window 120, are shown in FIG. 5. It clearly shows that good windowing can suppress RFI side-lobes more effectively than a rectangular window.

Windowing can suppress some of the side-lobes of RFI, but the performance in RFI suppression using merely windowing is usually not good enough. A further cancellation of RFI is usually required to achieve a satisfactory performance. RFI cancellation can be performed in either the analog domain (before analog-digital conversion) or in the digital domain (after analog-digital conversion). Analog RFI cancellers are less commonly used due to their drawbacks in design difficulty and mediocre performance. Digital RFI cancellers are more popular. Digital RFI cancellation can be performed in either the time domain (before FFT) or in the frequency domain (after FFT). In particular, MCM systems are inherently amenable to frequency domain signal processing and therefore prefer frequency domain RFI cancellation.

Figure 6:
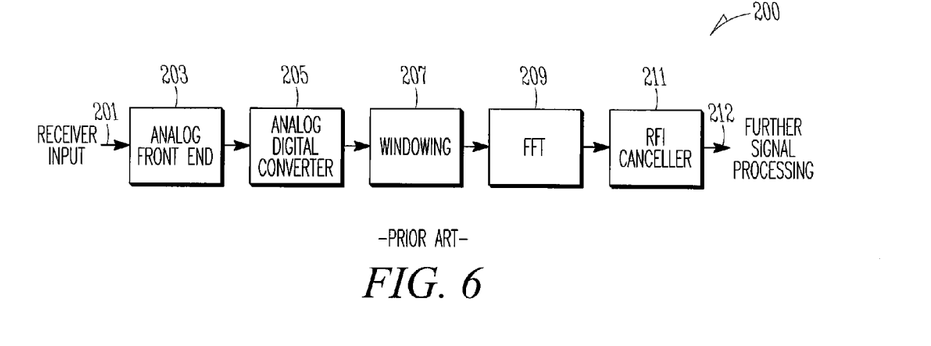
FIG. 6 illustrates a block diagram of a conventional VDSL receiver that may be used with some embodiments of the present invention.

A classic method of frequency domain RFI cancellation is described by Wiese and Bingham and is described in U.S. Pat. No. 6,014,412. An exemplary receiver block diagram that can utilize the Wiese and Bingham method is shown in FIG. 6. The receiver input 201 is processed by an analog front-end 203, converted into digital samples using an analog-to-digital converter 205, windowed 207 using, for example, a filter having a raised cosine response curve 112 or a rectangular response curve 110, and converted into frequency domain using FFT 209 which is an efficient implementation of Discrete Fourier Transform (DFT). Finally, the RFI contribution at the FFT output is cancelled by canceller 211.

The method described by Wiese and Bingham is based on the observation that, the FFT (using a rectangular window) of a purely sinusoidal RFI of frequency (n+δ) Δf is approximately $$RFI_{n+m} = \frac{A}{m-\delta} \qquad \text{Equation 1}$$

Figure 7:
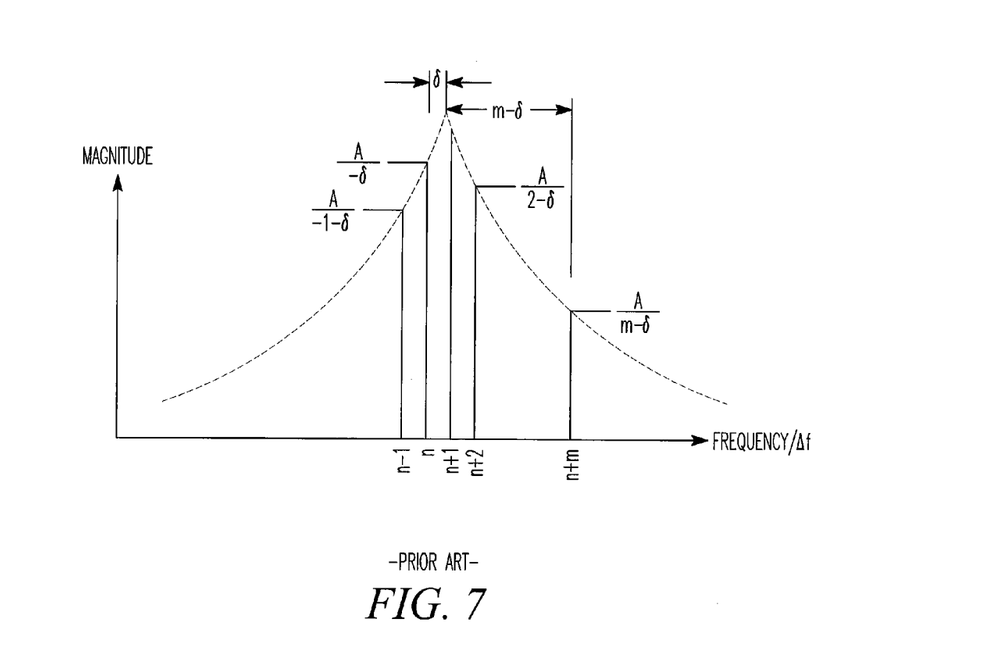
FIG. 7 is a frequency domain plot of the FFT output of FIG. 6.

Here, $RFI_{n+m}$ is the spectral component at frequency (n+m)·Δf, and A is a complex constant determined by the amplitude and phase of the RFI. FIG. 7 shows the FFT output that demonstrates the meanings of n, m, δ, and the roll-off of the magnitude as |m| increases. In the implementation of the Wiese and Bingham technique, one just simply chooses two arbitrary m's (say m=0 and m=1), finds $RFI_{n+m}$ for the respective m from the FFT output, applies Equation 1 to set up two linear equations to solve for the two unknowns δ and A. Once δ and A are obtained, the spectral component at any m can be computed and cancelled from the FFT output. This computation may be performed by a processor such as a Digital Signal Processor (DSP), a standard microprocessor and any other special or general processor.

In real life, the amplitude of the RFI is usually modulated by a slowly varying message content such as is typically found in RFI sourced by amateur radio. If the modulation causes the amplitude of the RFI to increase or decrease linearly with time (i.e., exhibiting a trapezoidal envelope) within the rectangular window, the FFT output is approximately $$RFI_{n+m} = \frac{A}{m-\delta} + \frac{B}{(m-\delta)^2} \qquad \text{Equation 2}$$

Here, A and B are two complex constants determined by the phase of the RFI, and the trapezoidal envelope. However, as mentioned above, rectangular windowing leads to high side-lobes in the FFT output and people usually resort to a better window, such as raised cosine window, that helps to suppress the side-lobes. Wiese and Bingham estimated that the effect of windowing can be approximated by multiplication by a single complex number $W_m$ for each value of m, i.e., $$RFI_{n+m} = \left[\frac{A}{m-\delta} + \frac{B}{(m-\delta)^2}\right] \cdot W_m \qquad \text{Equation 3}$$

Note that $W_m$ only depends on the window shape and can be pre-computed and stored beforehand. There are three unknowns in Equation 3: A, B and δ. Theoretically, it takes three equations to solve for three unknowns. To reduce the computation complexity, Wiese and Bingham described that δ can be obtained by finding the spectral components of the FFT output at m=0 and m=1 and then using the following approximation:

$$\delta = \frac{\left|\text{Re}\left\{\frac{RFI_{n+1}}{W_1}\right\}\right| + \left|\text{Im}\left\{\frac{RFI_{n+1}}{W_1}\right\}\right|}{\left|\text{Re}\left\{\frac{RFI_{n+1}}{W_1}\right\}\right| + \left|\text{Im}\left\{\frac{RFI_{n+1}}{W_1}\right\}\right| + \left|\text{Re}\left\{\frac{RFI_n}{W_0}\right\}\right| + \left|\text{Im}\left\{\frac{RFI_n}{W_0}\right\}\right|} \qquad \text{Equation 4}$$

Once δ is obtained, A and B can be solved using the following equation derived from applying Equation 3 to m=0 and m=1:

$$\begin{bmatrix} A \\ B \end{bmatrix} = \begin{bmatrix} -1 & 1 \\ 1-\delta & \delta \end{bmatrix} \begin{bmatrix} \delta^2 \frac{RFI_n}{W_0} \\ (1-\delta)^2 \frac{RFI_{n+1}}{W_1} \end{bmatrix} \qquad \text{Equation 5}$$

Once parameters A, B and δ are known, the RFI contribution to other spectral component can be estimated using Equation 3 for any m of interest. In this manner, RFI can be cancelled from the FFT output.

Wiese and Bingham also describe a method to improve the performance of their approximation by generalizing Equation 3 to Equation 6 to combat a more general envelope of RFI.

$$RFI_{n+m} = \left[\frac{A_1}{m-\delta} + \frac{A_2}{(m-\delta)^2} + \frac{A_3}{(m-\delta)^3} + ...\right] \cdot W_m \quad \text{Equation 6}$$

However, the computation involved in solving for the coefficients $A_1$, $A_2$, $A_3$, and so on, and applying Equation 6 is too complex to be practical. This computationally-complex estimation algorithm is difficult or impossible to perform during reception and processing of real-time signals.

There are several shortcomings in the existing RFI cancellation methods in general and in the method described by Wiese and Bingham in particular. For example, conventional RFI cancellation requires per tone reciprocal computation. To cancel the RFI contribution for a given m, we need to compute the factor $1/(m-\delta)$, which is data dependent and requires high computation complexity or large lookup table memory. In addition, the performance of these cancellation algorithms depends on the accuracy in the estimate of $\delta$. The estimate of $\delta$ using Equation 4 is not accurate when $\delta$ is small (near 0) or large (near 1). When the estimate of $\delta$ is off the mark, the estimates of A and B using Equation 5 are less accurate. In implementation, using Equation 3 results in poorer performance.

Yet another shortcoming of these conventional RFI cancellation methods is the severe performance degradation with non-trapezoidal envelope of the RFI signal. The RFI model described above assumes that the time-domain envelope is approximately trapezoidal during the window span. Once the envelope of the RFI significantly deviates from the linear approximation during the window span, the performance of RFI cancellation degrades dramatically. Higher order models may help, but the computation gets increasingly complicated. What is needed is a RFI cancellation scheme that requires lower computation complexity yet yields more accurate results.

SUMMARY OF THE INVENTION

Methods, apparatus and systems for cancellation of Radio Frequency Interference (RFI) are described. The spectral components of narrow-band radio frequency interference (RFI) can be represented as a Taylor series of $1/(m-1/2)$ where $m-1/2$ is the approximate distance (normalized to the tone spacing of the MCM system) between the frequency of interest and the center frequency of the RFI. Once the coefficients of the Taylor series are obtained, the spectral component of the RFI at any frequency can be estimated using the Taylor series. The coefficients of the Taylor series can be obtained by solving a set of linear equations using the FFT output at several properly chosen frequencies where the RFI components dominate. The coefficients for the Taylor series can therefore be formulated as linear combinations of the FFT output at the chosen frequencies. The coefficients of the linear combinations can be computed and stored beforehand. Therefore, only simple multiplications and additions are needed for obtaining the Taylor series coefficients from the FFT output at the chosen frequencies. The factor $1/(m-1/2)$ and its powers are all data independent and thus can also be computed and stored beforehand for the m's of interest. Therefore, only simple multiplications and additions are needed for obtaining the spectral component of RFI at any frequency of interest. This invention offers a much less computational complexity and also provides much better performance than the conventional methods and those described by Wiese and Bingham.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION OF THE INVENTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled.

In the following description, numerous specific details are set forth. However, it is understood that embodiments of the invention may be practiced without these specific details. In other instances, well-known circuits, structures and techniques have not been shown in detail in order not to obscure the understanding of this description. Additionally, in this description, the phrase "exemplary embodiment" means that the embodiment being referred to serves as an example or illustration. While the specification described several example embodiments of the invention considered best modes of practicing the invention, it should be understood that the invention can be implemented in many ways and is not limited to the particular examples described below or to the particular manner in which any features of such examples are implemented.

Figure 8:
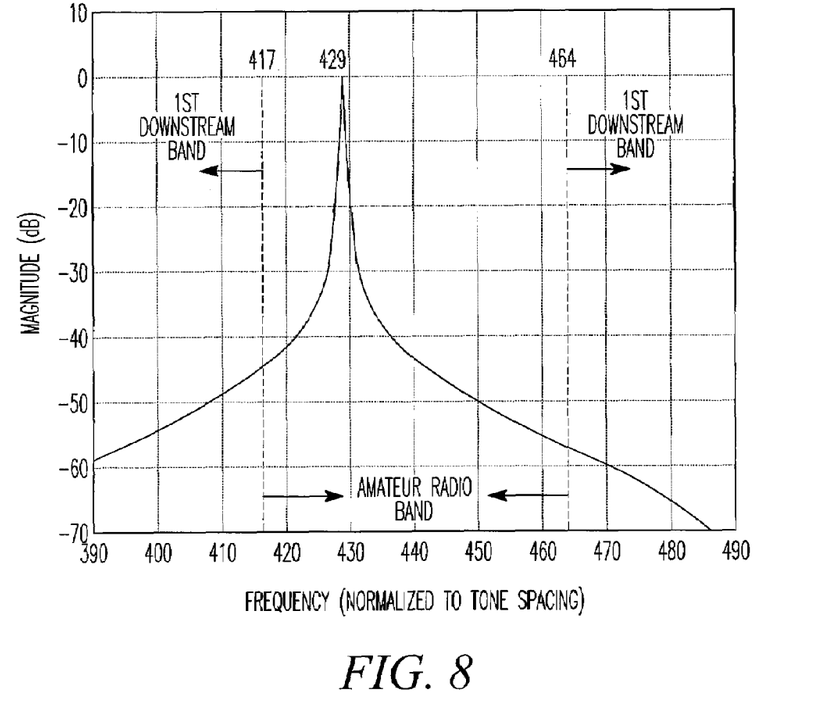
FIG. 8 illustrates a frequency domain plot of RFI energy of an amateur radio signal and the side lobe energy that spills into the downstream band according to some embodiments of the present invention.
Figure 9:
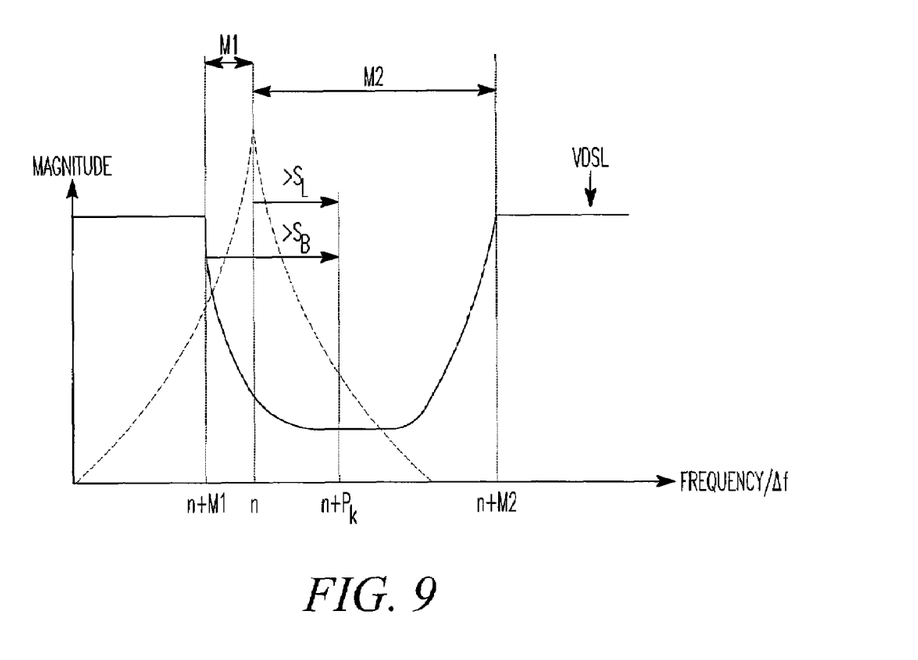
FIG. 9 illustrates a frequency domain plot of RFI energy estimated from side lobe energy measured farthest away from the amateur radio band edge according to some embodiments of the present invention.

This present invention relates to a method of canceling the interference from a narrow-band radio frequency transmitter to a multi-carrier modulation (MCM) system. This present invention uses VDSL as an example of a MCM system in an exemplary embodiment of the present invention. As mentioned earlier, in the presence of RFI, the VDSL systems will avoid using tones whose frequencies fall in the amateur radio band to ensure the quality of data transmission. For example, if there is a RFI centered at 1.85 MHz (=428.99×Δf, i.e., n=428 and δ=0.99), a VDSL system must avoid using the tones that fall in the amateur radio band 1.8 MHz-2.0 MHz, which lies in the 1$^{st}$ downstream band, as shown in FIG. 8. The spectral components of the RFI within the amateur radio band 1.8 MHz-2.0 MHz can be readily obtained from the FFT output, because there is no VDSL data transmission in the radio band except for a small amount of side-lobe leakage. On the other hand, the RFI components below 1.8 MHz or above 2.0 MHz are interfering with the VDSL data transmission and need to be estimated and subtracted from the FFT output. In other words, we may use the readily available values of $RFI_{n+m}$ for $417 < n+m \leq 464$ to estimate and cancel $RFI_{n+m}$ from the FFT output for $n+m \leq -17$ or $n+m \leq 464$. That is, we only need to estimate and cancel $RFI_{n+m}$ for $m \leq 11$ or $m \leq 36$. In general, we need to use the readily available values of $RFI_{n+m}$ for $M1 < m < M2$ to estimate and cancel $RFI_{n+m}$ for $m \leq M1$ or $m \geq M2$, where M1 is a negative integer and M2 is a positive integer. The distance between the RFI center frequency and the upper (lower) amateur radio band edge determine M1 (M2), as shown in FIG. 9.

Note that prior art RFI canceller described by Wiese and Bingham is based on Equation 6. Since δ lies between 0 and 1, we can perform a Taylor series expansion on δ around ½ and obtain $$RFI_{n+m} = \left[ \frac{A_1}{m-\frac{1}{2}} + \frac{A_2}{\left(m-\frac{1}{2}\right)^2} + \frac{A_3}{\left(m-\frac{1}{2}\right)^3} + \frac{A_4}{\left(m-\frac{1}{2}\right)^4} + \ldots \right] \cdot$$

$$W_m + \varepsilon \cdot \left[ \frac{A_1}{\left(m-\frac{1}{2}\right)^2} + \frac{2 \cdot A_2}{\left(m-\frac{1}{2}\right)^3} + \frac{3 \cdot A_3}{\left(m-\frac{1}{2}\right)^4} + \ldots \right] \cdot W_m +$$

$$\varepsilon^2 \cdot \left[ \frac{A_1}{\left(m-\frac{1}{2}\right)^3} + \frac{3 \cdot A_2}{\left(m-\frac{1}{2}\right)^4} + \frac{6 \cdot A_3}{\left(m-\frac{1}{2}\right)^5} + \ldots \right] \cdot W_m +$$

(higher order terms in ε)

Equation 7

Here, ε is the difference between δ and ½, i.e., ε=δ−½. We may collect terms of the same order in 1/(m−1/2) and obtain $$RFI_{n+m} = \left[ \frac{C_1}{m-\frac{1}{2}} + \frac{C_2}{\left(m-\frac{1}{2}\right)^2} + \frac{C_3}{\left(m-\frac{1}{2}\right)^3} + \ldots \right] \cdot W_m$$

Equation 8

Here, $C_1, C_2, C_3, \ldots$, and so on, are the coefficients that we need to solve for. Once we obtain $C_1, C_2, C_3, \ldots$, and so on, we can use Equation 8 to compute RFI for any m. In this manner, 6 has been absorbed in the coefficients $C_2, C_3, \ldots$, and so on, and is no longer needed in RFI cancellation. This not only reduces the computation efforts, but also eliminates the problem due to inaccurate δ that results in poor RFI cancellation in the prior art.

Next, we'll show how to solve for $C_1, C_2, C_3$, and so on. For a general case, we consider up to K terms in 1/(m−1/2) in equation 9:

$$RFI_{n+m} =$$

Equation 9

$$\left[ \frac{C_1}{m-\frac{1}{2}} + \frac{C_2}{\left(m-\frac{1}{2}\right)^2} + \frac{C_3}{\left(m-\frac{1}{2}\right)^3} + \ldots + \frac{C_K}{\left(m-\frac{1}{2}\right)^K} \right] \cdot W_m$$

Pick K different integers, say $P_1, P_2, \ldots$, to $P_K$, which can be either positive or negative. They can be arbitrary but preferably not too large (say the absolute value is no greater than 20) or too small (say the absolute value is no less than 2). Apply Equation 9 for $m=P_k$, for k from 1 to K, and obtain the following linear system of equations:

$$\begin{bmatrix} \frac{RFI_{n+P_1}}{W_{P_1}} \\ \frac{RFI_{n+P_2}}{W_{P_2}} \\ \vdots \\ \frac{RFI_{n+P_K}}{W_{P_K}} \end{bmatrix} =$$

Equation 10

$$\begin{bmatrix} \frac{1}{P_1-\frac{1}{2}} & \frac{1}{\left(P_1-\frac{1}{2}\right)^2} & \cdots & \frac{1}{\left(P_1-\frac{1}{2}\right)^K} \\ \frac{1}{P_2-\frac{1}{2}} & \frac{1}{\left(P_2-\frac{1}{2}\right)^2} & \cdots & \frac{1}{\left(P_2-\frac{1}{2}\right)^K} \\ \vdots & \vdots & \ddots & \vdots \\ \frac{1}{P_K-\frac{1}{2}} & \frac{1}{\left(P_K-\frac{1}{2}\right)^2} & \cdots & \frac{1}{\left(P_K-\frac{1}{2}\right)^K} \end{bmatrix}^{-1} \cdot \begin{bmatrix} C_1 \\ C_2 \\ \vdots \\ C_K \end{bmatrix}$$

The coefficients $C_1, C_2, \ldots,$ to $C_K$ can be obtained using matrix inversion:

$$\begin{bmatrix} C_1 \\ C_2 \\ \vdots \\ C_K \end{bmatrix} = \quad \text{Equation 11}$$

$$\begin{bmatrix} \frac{1}{P_1 - \frac{1}{2}} & \frac{1}{\left(P_1 - \frac{1}{2}\right)^2} & \cdots & \frac{1}{\left(P_1 - \frac{1}{2}\right)^K} \\ \frac{1}{P_2 - \frac{1}{2}} & \frac{1}{\left(P_2 - \frac{1}{2}\right)^2} & \cdots & \frac{1}{\left(P_2 - \frac{1}{2}\right)^K} \\ \vdots & \vdots & \ddots & \vdots \\ \frac{1}{P_K - \frac{1}{2}} & \frac{1}{\left(P_K - \frac{1}{2}\right)^2} & \cdots & \frac{1}{\left(P_K - \frac{1}{2}\right)^K} \end{bmatrix}^{-1} \cdot \begin{bmatrix} \frac{RFI_{n+P_1}}{W_{P_1}} \\ \frac{RFI_{n+P_2}}{W_{P_2}} \\ \vdots \\ \frac{RFI_{n+P_K}}{W_{P_K}} \end{bmatrix}$$

In practice, $P_1, P_2, \ldots,$ to $P_K$ can be all pre-selected and the matrix inversion can be computed and stored beforehand. Note that the absolute value of each of $P_1, P_2, \ldots,$ to $P_K$ can not be too large, so that they all correspond to frequencies that are in the proximity of the center of the RFI frequency and therefore their respective frequency domain data is dominated by the RFI component. Therefore, the frequency domain data at $(n+P_1) \times \Delta f$, $(n+P_2) \times \Delta f$, $(n+P_3) \times \Delta f$, and so on serve as good representatives of the RFI.

For example, consider only two terms (K=2):

$$\begin{bmatrix} C_1 \\ C_2 \end{bmatrix} = \begin{bmatrix} \frac{1}{P_1 - \frac{1}{2}} & \frac{1}{\left(P_1 - \frac{1}{2}\right)^2} \\ \frac{1}{P_2 - \frac{1}{2}} & \frac{1}{\left(P_2 - \frac{1}{2}\right)^2} \end{bmatrix}^{-1} \cdot \begin{bmatrix} \frac{RFI_{n+P_1}}{W_{P_1}} \\ \frac{RFI_{n+P_2}}{W_{P_2}} \end{bmatrix} \quad \text{Equation 12}$$

We do the matrix inversion and obtain the following equation:

$$\begin{bmatrix} C_1 \\ C_2 \end{bmatrix} = \quad \text{Equation 13}$$

$$\begin{bmatrix} \frac{\left(P_1 - \frac{1}{2}\right)^2}{W_{P_1}(P_1 - P_2)} & -\frac{\left(P_2 - \frac{1}{2}\right)^2}{W_{P_2}(P_1 - P_2)} \\ -\frac{\left(P_1 - \frac{1}{2}\right)^2 \left(P_2 - \frac{1}{2}\right)}{W_{P_1}(P_1 - P_2)} & \frac{\left(P_1 - \frac{1}{2}\right) \left(P_2 - \frac{1}{2}\right)^2}{W_{P_2}(P_1 - P_2)} \end{bmatrix} \cdot \begin{bmatrix} RFI_{n+P_1} \\ RFI_{n+P_2} \end{bmatrix}$$

$P_1$ and $P_2$ can be pre-selected, or can be limited to be selected from a pre-defined set of values. In either way, the 2×2 matrix elements in Equation 13 are all data independent and thus can be pre-computed and stored. $RFI_{n+P_1}$ and $RFI_{n+P_2}$ are readily available from the FFT output at $(n+P_1) \times \Delta f$ and $(n+P_2) \times \Delta f$. Therefore, there are only four complex multiplications and two complex additions involved in calculating $C_1$ and $C_2$. Again, this is a big improvement over the prior art, which involves much more computation in calculating $\delta$, $A_1$ and $A_2$. The factors $W_m/(m-1/2)$ and $W_m(m-1/2)^2$ can also be pre-computed and stored beforehand, so the computation of Equation 9 for K=2 only requires two complex multiplications and one complex addition for each tone (i.e., each m) of interest in RFI cancellation. This again is a big improvement over the prior art (which involves two real divisions).

To pursue even better performance, we may choose to use more terms in another embodiment of the present invention. For example, for K=3 we have $$\begin{bmatrix} C_1 \\ C_2 \\ C_3 \end{bmatrix} = \begin{bmatrix} \frac{1}{P_1 - \frac{1}{2}} & \frac{1}{\left(P_1 - \frac{1}{2}\right)^2} & \frac{1}{\left(P_1 - \frac{1}{2}\right)^3} \\ \frac{1}{P_2 - \frac{1}{2}} & \frac{1}{\left(P_2 - \frac{1}{2}\right)^2} & \frac{1}{\left(P_2 - \frac{1}{2}\right)^3} \\ \frac{1}{P_3 - \frac{1}{2}} & \frac{1}{\left(P_3 - \frac{1}{2}\right)^2} & \frac{1}{\left(P_3 - \frac{1}{2}\right)^3} \end{bmatrix}^{-1} \cdot \begin{bmatrix} \frac{RFI_{n+P_1}}{W_{P_1}} \\ \frac{RFI_{n+P_2}}{W_{P_2}} \\ \frac{RFI_{n+P_3}}{W_{P_3}} \end{bmatrix} \quad \text{Equation 14}$$

We do the matrix inversion and obtain $$\begin{bmatrix} C_1 \\ C_2 \\ C_3 \end{bmatrix} = \begin{bmatrix} \frac{\left(P_1 - \frac{1}{2}\right)^3}{(P_2 - P_1)(P_3 - P_1)W_{P_1}} & -\frac{\left(P_2 - \frac{1}{2}\right)^3}{(P_2 - P_1)(P_3 - P_2)W_{P_2}} & \frac{\left(P_3 - \frac{1}{2}\right)^3}{(P_3 - P_1)(P_3 - P_2)W_{P_3}} \\ -\frac{\left(P_1 - \frac{1}{2}\right)^3 (P_2 + P_3 - 1)}{(P_2 - P_1)(P_3 - P_1)W_{P_1}} & \frac{\left(P_2 - \frac{1}{2}\right)^3 (P_1 + P_3 - 1)}{(P_2 - P_1)(P_3 - P_2)W_{P_2}} & -\frac{\left(P_3 - \frac{1}{2}\right)^3 (P_1 + P_2 - 1)}{(P_3 - P_1)(P_3 - P_2)W_{P_3}} \\ \frac{\left(P_1 - \frac{1}{2}\right)^3 \left(P_2 - \frac{1}{2}\right)\left(P_3 - \frac{1}{2}\right)}{(P_2 - P_1)(P_3 - P_1)W_{P_1}} & -\frac{\left(P_2 - \frac{1}{2}\right)^3 \left(P_1 - \frac{1}{2}\right)\left(P_3 - \frac{1}{2}\right)}{(P_2 - P_1)(P_3 - P_2)W_{P_2}} & \frac{\left(P_3 - \frac{1}{2}\right)^3 \left(P_1 - \frac{1}{2}\right)\left(P_2 - \frac{1}{2}\right)}{(P_3 - P_1)(P_3 - P_2)W_{P_3}} \end{bmatrix} \cdot \begin{bmatrix} RFI_{n+P_1} \\ RFI_{n+P_2} \\ RFI_{n+P_3} \end{bmatrix} \quad \text{Equation 15}$$

$P_1$, $P_2$, and $P_3$ can be pre-selected, or can be limited to be selected from a pre-defined set of values. In either way, the 3×3 matrix elements in Equation 15 are all data independent and thus can be pre-computed and stored. $RFI_{n+P1}$, $RFI_{n+P2}$, and $RFI_{n+P3}$ are readily available from the FFT output at $(n+P_1)\times\Delta f$, $(n+P_2)\times\Delta f$, and $(n+P_3)\times\Delta f$. Therefore, there are only nine complex multiplications and six complex additions involved in calculating $C_1$, $C_2$ and $C_3$. Again, this is a big improvement over the prior art, which involves much more computation in calculating $\delta$, $A_1$ and $A_2$. The factors $W_m/(m-1/2)$, $W_m/(m-1/2)^2$, and $W_m/(m-1/2)^3$ can also be pre-computed and stored beforehand, so the computation of Equation 9 for K=3 only requires three complex multiplications and two complex addition for each tone (i.e., each m) of interest in RFI cancellation. This exemplary embodiment of the present invention is again another improvement over the prior art (which involves two real divisions).

The following steps outline embodiments of the new RFI cancellation algorithm based on Equation 9 for K=2 in an exemplary embodiment of the present invention:

1. Obtain the frequency domain data from the FFT output of a MCM receiver.

2. For each restricted frequency sub-band (the sub-carriers within which are excluded from MCM data transmission), identify the peak of FFT output within the sub-band, say the peak occurs at $n\_peak\times\Delta f$ and the peak is $RFI_{n\_peak}$.

3. Compare $|RFI_{n\_peak}|$ with a pre-defined threshold $RFI_{peak\_min}$. If $|RFI_{n\_peak}|$ is below the threshold, there is either no RFI in this amateur radio band, or the RFI is too weak. Stop here and move on to step 2 for next sub-band, because there is no need to do RFI cancellation. Otherwise, continue to step 4.

4. Compare the magnitude of FFT output at $(n_{peak}-1)\times\Delta f$ and the magnitude of FFT output at $(n\_peak+1)\times\Delta f$. If the former is greater than the latter, set n=n_peak−1. Otherwise, set n=n_peak.

5. Set M1=floor ((lower edge of the sub-band)/$\Delta f$)−n, and set M2=ceil ((upper edge of the sub-band)/$\Delta f$)−n.

6. Pick an integer $P_1$ such that $M1<P_1<0$ or $0<P_1<M2$, and then an integer $P_2$ such that $M1<P_2<0$ or $0<P_2<M2$ and $P_1 \neq P_2$ 7. Calculate $C_1$ and $C_2$ using $$\begin{bmatrix} C_1 \\ C_2 \end{bmatrix} = \begin{bmatrix} \frac{\left(P_1-\frac{1}{2}\right)^2}{W_{P_1}(P_1-P_2)} & -\frac{\left(P_2-\frac{1}{2}\right)^2}{W_{P_2}(P_1-P_2)} \\ -\frac{\left(P_1-\frac{1}{2}\right)^2\left(P_2-\frac{1}{2}\right)}{W_{P_1}(P_1-P_2)} & \frac{\left(P_1-\frac{1}{2}\right)\left(P_2-\frac{1}{2}\right)^2}{W_{P_2}(P_1-P_2)} \end{bmatrix} \cdot \begin{bmatrix} RFI_{n+P_1} \\ RFI_{n+P_2} \end{bmatrix}$$

8. For m=(M1−L1) to M1, subtract $$RFI_{n+m} = \left[\frac{C_1}{m-\frac{1}{2}} + \frac{C_2}{\left(m-\frac{1}{2}\right)^2}\right] \cdot W_m$$

from the FFT output at $(n+m)\times\Delta f$, where L1 is a predefined positive integer.

9. For m=M2 to (M2+L2), subtract $$RFI_{n+m} = \left[\frac{C_1}{m-\frac{1}{2}} + \frac{C_2}{\left(m-\frac{1}{2}\right)^2}\right] \cdot W_m$$

from the FFT output at $(n+m)\times\Delta f$, where L2 is a predefined positive integer.

10. Move to step 2 for next sub-band until all amateur radio bands are searched. The same algorithm can be easily extended to K=3 in another embodiment.

When K=2, the parameters $P_1$ and $P_2$ are two indices representing two frequency components of RFI that are chosen as references and used to estimate the rest of RFI components. The two distinct differences between the prior art and this present invention are that $(P_1, P_2)$ are restricted to be $(0, 1)$ in the prior art method, while in embodiments of the present invention $P_1$ and $P_2$ are selectable and chosen to obtain the optimal performance. Further, the prior art techniques need to estimate three parameters $\delta$, A, and B, while an embodiment of the present invention only needs to estimate two parameters $C_1$ and $C_2$. Note that A and B are analogous to $C_1$ and $C_2$ respectively, but the parameter $\delta$, which is crucial in the prior art, is no longer needed in embodiments of the present invention.

Figure 10:
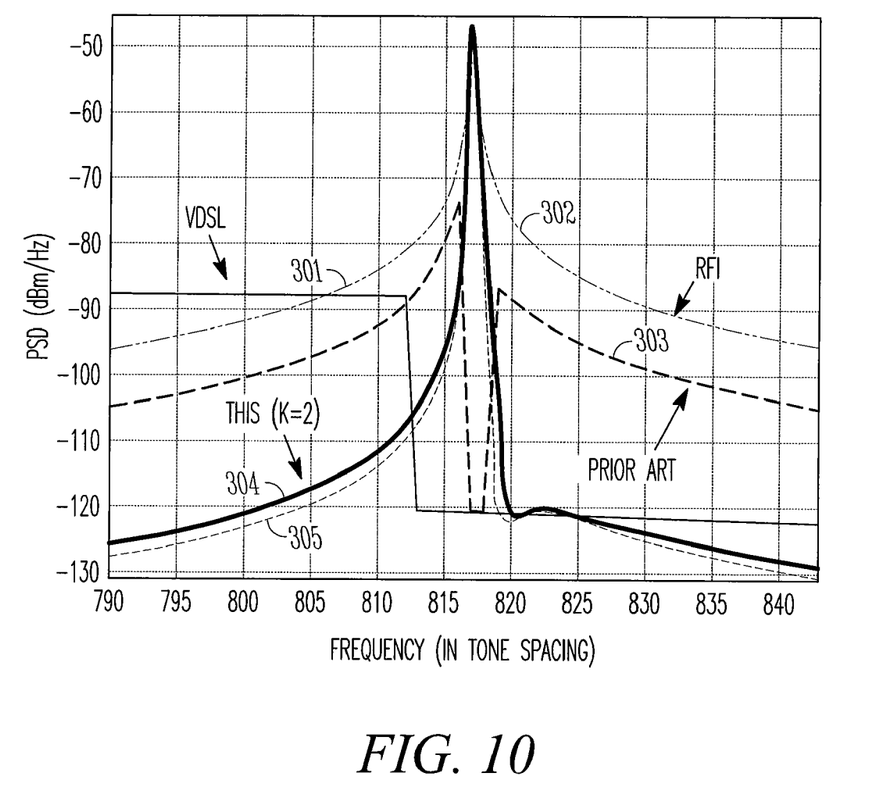
FIG. 10 illustrates a frequency domain plot comparing the performance of various RFI cancellation techniques.

Next is a demonstration of the method to select $P_1$ and $P_2$ to ensure good performance. First, $|P_1|$ and $|P_2|$ will always need to be greater than a predefined lower bound $(S_L)$, say 2. The Taylor expansion of $1/(m-\delta)$ to the $1^{st}$ order in $(\delta-1/2)$ for $m=|P_1|$ or $|P_2|$ may have a relatively large residual error if $|P_1|$ or $|P_2|$ is extremely small, for example 0 or 1. Second, the distance between $P_1$ (or $P_2$) and its respective nearest radio band edge needs to be always greater than a predefined lower band $(S_B)$. This ensures the effect of the side-lobe of VDSL signal on the RFI estimate is negligible. Under these constraints, $P_1$ and $P_2$ will most likely be chosen from the side that is farther away from the amateur radio band edge as shown in FIG. 9. In general, the rules for selecting $P_k$ (for k=1,2, ..., K) are 1. $|P_k|>S_L$
2. $M1+S_B<P_k<M2-S_B$
3. $P_j \neq P_k$ for $j \neq k$ FIG. 10 shows a simulation result for comparing prior art with embodiments of the present invention. FIG. 10 shows five traces: (1) the VDSL components which have a small amount of leakage into the amateur radio band identified as trace 301 in FIG. 10; (2) the RFI components which are centered at $815.87\times\Delta f$, modulated by a quadratic envelope in the time span of interest, identified as trace 302 in FIG. 10; (3) the residual RFI components after applying the prior art technique, identified as trace 303 in FIG. 10; (4) the residual RFI components after applying some embodiments of the present invention using K=2 with the choice of $P_1$=4 and $P_2$=8, and as identified as trace 304 in FIG. 10; and (5) the residual RFI components after applying other embodiments of the present invention using K=3 with the choice of $P_1$=2, $P_2$=4 and $P_3$=6. It shows this invention offers about 20-dB better performance in RFI suppression in the VDSL band than the prior art. Also, K=2 almost performs as well as K=3.

Figure 11:
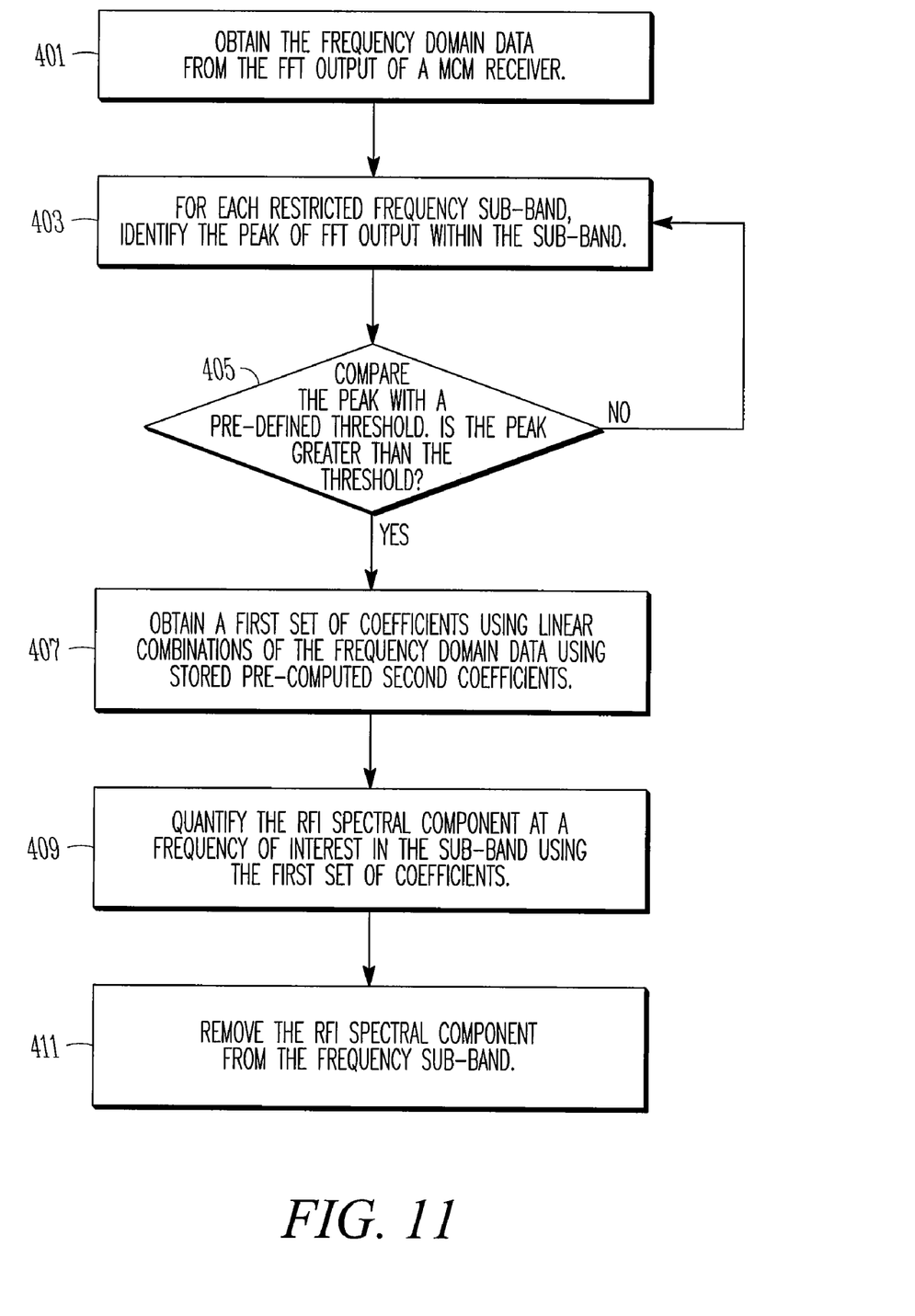
FIG. 11 is a flow chart describing an exemplary method of operation according to some embodiments of the present invention.

FIG. 11 is a flow chart describing an exemplary method of operation according to embodiments of the present invention. The operation of the RFI canceller begins at the output of the FFT 209 as shown in FIG. 4. Beginning at step 401, the digital frequency domain data is obtained from the FFT output of a MCM receiver. For each restricted frequency sub-band, we identify the peak of the FFT output within the sub-band at step 403. By comparing the peak with a pre-defined threshold, we can determine if there is RFI present. If there is no RFI, the process repeats at 403 for the next frequency sub-band. If RFI is present, the process moves on to step 407 to obtain a first set of coefficients using linear combinations of the frequency domain data using stored pre-computed second coefficients. Once the coefficients are obtained, the process computes the quantity of the RFI spectral component at a frequency of interest in the sub-band at step 409. With the estimated value of the RFI component in the signal, the RFI spectral component is removed from the signals in the sub-band at 411.

In accordance with further embodiments of the present invention, the RFI spectral component at frequency $(n+m) \times \Delta f$ can be estimated using the Taylor series shown in Equation 9, while the coefficients $C_1, C_2, \ldots$, and so on, in Equation 9 can be obtained from the linear combinations of the frequency domain data at $(n+P_1) \times \Delta f, (n+P_2) \times \Delta f, \ldots$, and so on, where the RFI dominates, using Equation 11. We may combine Equation 9 and Equation 11 into one equation which directly expresses the RFI component at frequency $(n+m) \times \Delta f$ as a linear combination of the frequency domain data at $(n+P_1) \times \Delta f, (n+P_2) \times \Delta f, \ldots$, and so on, where the RFI dominates. For the example of K=2, we may rewrite Equation 9 as $$RFI_{n+m} = \left[ \frac{C_1}{m - \frac{1}{2}} + \frac{C_2}{\left(m - \frac{1}{2}\right)^2} \right] \cdot W_m \quad \text{Equation 16}$$

$$= \left[ \frac{W_m}{m - \frac{1}{2}} \quad \frac{W_m}{\left(m - \frac{1}{2}\right)^2} \right] \begin{bmatrix} C_1 \\ C_2 \end{bmatrix}$$

Then we replace the column vector $$\begin{bmatrix} C_1 \\ C_2 \end{bmatrix}$$

with the expression in Equation 13, which is the special case of Equation 11 for K=2, and obtain $$RFI_{n+m} = \left[ \frac{W_m}{m - \frac{1}{2}} \quad \frac{W_m}{\left(m - \frac{1}{2}\right)^2} \right] \begin{bmatrix} C_1 \\ C_2 \end{bmatrix} \quad \text{Equation 17}$$

$$= \left[ \frac{W_m}{m - \frac{1}{2}} \quad \frac{W_m}{\left(m - \frac{1}{2}\right)^2} \right] \begin{bmatrix} \frac{\left(P_1 - \frac{1}{2}\right)^2}{W_{P_1}(P_1 - P_2)} & -\frac{\left(P_2 - \frac{1}{2}\right)^2}{W_{P_2}(P_1 - P_2)} \\ -\frac{\left(P_1 - \frac{1}{2}\right)^2 \left(P_2 - \frac{1}{2}\right)}{W_{P_1}(P_1 - P_2)} & \frac{\left(P_1 - \frac{1}{2}\right)\left(P_2 - \frac{1}{2}\right)^2}{W_{P_2}(P_1 - P_2)} \end{bmatrix} \cdot \begin{bmatrix} RFI_{n+P_1} \\ RFI_{n+P_2} \end{bmatrix}$$

$$= [F_1 \quad F_2] \begin{bmatrix} RFI_{n+P_1} \\ RFI_{n+P_2} \end{bmatrix}$$

where $$[F_1 \quad F_2] = \left[ \frac{W_m}{m - \frac{1}{2}} \quad \frac{W_m}{\left(m - \frac{1}{2}\right)^2} \right] \begin{bmatrix} \frac{\left(P_1 - \frac{1}{2}\right)^2}{W_{P_1}(P_1 - P_2)} & -\frac{\left(P_2 - \frac{1}{2}\right)^2}{W_{P_2}(P_1 - P_2)} \\ -\frac{\left(P_1 - \frac{1}{2}\right)^2 \left(P_2 - \frac{1}{2}\right)}{W_{P_1}(P_1 - P_2)} & \frac{\left(P_1 - \frac{1}{2}\right)\left(P_2 - \frac{1}{2}\right)^2}{W_{P_2}(P_1 - P_2)} \end{bmatrix} \quad \text{Equation 18}$$

Equation 17 states that the RFI component at frequency $(n+m) \times \Delta f$ can be estimated using a linear combination of the frequency domain data at $(n+P_1) \times \Delta f$ and $(n+P_2) \times \Delta f$, where the RFI dominates, using coefficients $F_1$ and $F_2$ which are signal independent and can be pre-computed and stored using Equation 18. In general, the RFI component at frequency $(n+m) \times \Delta f$ can be estimated using the linear combinations of RFI components at $(n+P_1) \times \Delta f, (n+P_2) \times \Delta f, (n+P_3) \times \Delta f$, and so on, using the following equation $$RFI_{n+m} = [F_1 \quad F_2 \quad \ldots \quad F_K] \begin{bmatrix} RFI_{n+P_1} \\ RFI_{n+P_2} \\ \vdots \\ RFI_{n+P_K} \end{bmatrix} \quad \text{Equation 19}$$

where $$[F_1 \quad F_2 \quad \ldots \quad F_K] = \left[ \frac{W_m}{m - \frac{1}{2}} \quad \frac{W_m}{\left(m - \frac{1}{2}\right)^2} \quad \cdots \quad \frac{W_m}{\left(m - \frac{1}{2}\right)^K} \right] \begin{bmatrix} \frac{R_{11}}{W_{P_1}} & \frac{R_{12}}{W_{P_2}} & \cdots & \frac{R_{1K}}{W_{P_K}} \\ \frac{R_{21}}{W_{P_1}} & \frac{R_{22}}{W_{P_2}} & \cdots & \frac{R_{2K}}{W_{P_K}} \\ \vdots & \vdots & \ddots & \vdots \\ \frac{R_{K1}}{W_{P_1}} & \frac{R_{K2}}{W_{P_2}} & \cdots & \frac{R_{KK}}{W_{P_K}} \end{bmatrix} \quad \text{Equation 20}$$

and $R_{kl}$ is an element of the inverse matrix shown in Equation 11, i.e.

$$\begin{bmatrix} R_{11} & R_{12} & \ldots & R_{1K} \\ R_{21} & R_{22} & \ldots & R_{2K} \\ \vdots & \vdots & \ddots & \vdots \\ R_{K1} & R_{K2} & \ldots & R_{KK} \end{bmatrix} = \quad \text{Equation 21}$$

-continued $$\begin{bmatrix} \frac{1}{P_1 - \frac{1}{2}} & \frac{1}{\left(P_1 - \frac{1}{2}\right)^2} & \cdots & \frac{1}{\left(P_1 - \frac{1}{2}\right)^K} \\ \frac{1}{P_2 - \frac{1}{2}} & \frac{1}{\left(P_2 - \frac{1}{2}\right)^2} & \cdots & \frac{1}{\left(P_2 - \frac{1}{2}\right)^K} \\ \vdots & \vdots & \ddots & \vdots \\ \frac{1}{P_K - \frac{1}{2}} & \frac{1}{\left(P_K - \frac{1}{2}\right)^2} & \cdots & \frac{1}{\left(P_K - \frac{1}{2}\right)^K} \end{bmatrix}^{-1}$$

In this manner, the frequency domain data at $(n+P_1) \times \Delta f$, $(n+P_2) \times \Delta f$, $(n+P_3) \times \Delta f$, ..., and so on, where the RFI dominates, are chosen as representatives of the RFI and they form a basis, from which a linear combination can be used to represent the RFI component at any frequency of interest. This embodiment is a further improvement over the aforementioned two-step embodiment of the present invention as described above, in which we first obtain the Taylor series coefficients using linear combinations of the RFI components at n+P1, n+P2, ..., and then we evaluate the Taylor series.

Figure 12:
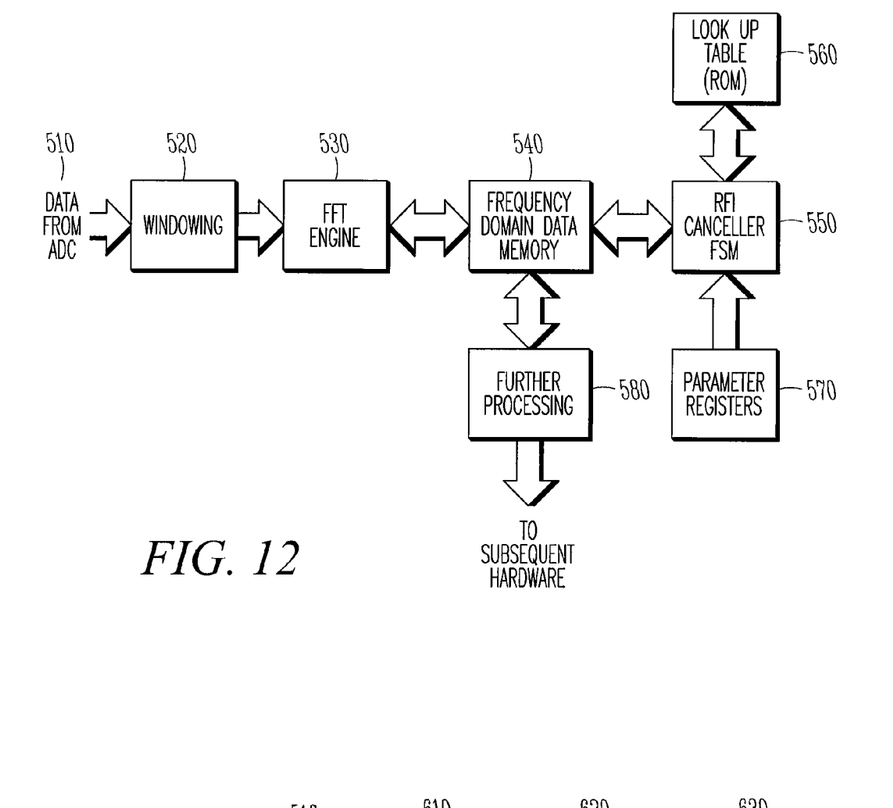
FIG. 12 depicts an exemplary embodiment of implementing a RFI canceller using a hardwired finite state machine (FSM).

The method of performing digital RFI cancellation in accordance with the present invention can be implemented either as a hard-wired finite state machine or as a software program executed by a general purpose microprocessor or a DSP (digital signal processing) processor. FIG. 12 depicts an exemplary embodiment of implementing a RFI canceller using a hardwired Finite State Machine (FSM). The time domain data from the Analog-to-Digital Converter (ADC) 510 is passed to a windowing function 520, which passes the windowed (and possibly folded as mentioned above) time domain data to a Fast Fourier Transform (FFT) engine 530. The FFT engine 530 processes the time domain data and generates frequency domain data, which are stored in a memory 540, which can be a Random Access Memory (RAM) in an embodiment, or other types of memory storage. The FFT engine 530 usually does not generate the final frequency domain data directly. Instead, the FFT engine may need to generate and store intermediate data first. Therefore, the FFT engine 530 also accesses the memory 540, which can be used to store the intermediate data.

After the final frequency domain data are generated and stored in the memory 540, a RFI canceller FSM 550 reads data from the memory 540, determines if there is RFI and cancels it, according to embodiments of the present invention described more fully above. While performing RFI cancellation, RFI canceller FSM 550 reads the coefficients $F_1$, $F_2$, and so on from a look up table 560, which can be a Read Only Memory (ROM) in an embodiment, or other types of memory storage devices. Also, RFI canceller FSM 550 also needs to obtain parameters which can be read from a series of parameter registers 570 that store the pre-defined parameters such as the radio frequency band definition, the threshold of RFI, parameters $P_1$, $P_2$, by way of example and not be way of limitation. The parameter registers 570 are configurable in some embodiments of the present invention.

After performing RFI cancellation, the frequency domain data are modified and stored back into the memory 540. In some embodiments, a further processing unit 580 reads the frequency domain data from the memory 540, performs further processing, and stores them back into the memory 580, or passes the data to subsequent hardware block. Also in some embodiments, the RFI canceller 550 and the further processing 580 may be performed by a single processing unit such as a Digital Signal Processor (DSP) or a microprocessor.

Figure 13:
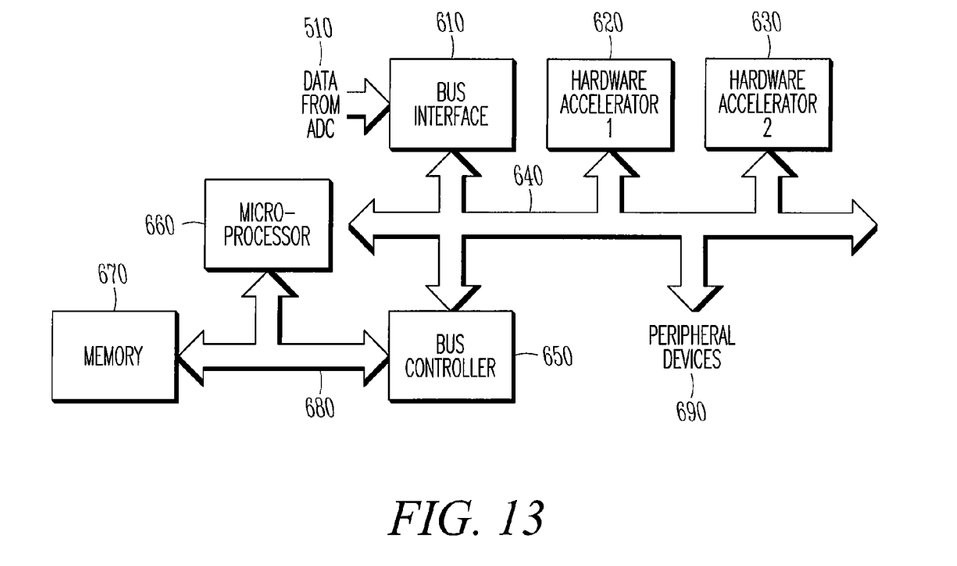
FIG. 13 depicts an exemplary embodiment of implementing the RFI canceller using a microprocessor.

FIG. 13 depicts an exemplary embodiment of implementing the RFI canceller using a microprocessor 660. In the embodiment shown in FIG. 13, the RFI cancellation function is implemented as a series of software instructions stored in the memory 670. In addition to instructions, the memory 670 may also store run-time data such as parameters, coefficients, intermediate results, and other information and instructions. In the embodiment shown in FIG. 13, the microprocessor 660 reads the instructions from the memory 670 through an internal bus 680. Those skilled in the art will readily recognize that other microprocessor architectures may be used which differ from that shown in FIG. 13 without departing from the scope of the claimed invention.

The microprocessor 660 also reads the frequency domain data from the memory 670, process them according to the RFI cancellation instructions, and writes the processed frequency domain data back into the memory 670. A bus controller 650 connected to the internal bus 680 serves as a bridge between the internal bus 680 and an external bus 640. A bus interface 610 is used to allow the data from ADC 510 to be stored into the memory 670 through the external bus 640, the bus controller 650, and the internal bus 680. An optional series of hardware accelerators 620, 630, and so on, each of which may implement a specific function such as windowing, FFT, and so on, may also interface with the external bus 640, and thus are able to access the data in the memory 670. Some peripheral device(s) 690, such as disk drives, may also interface with the external bus 640 to access the data stored in the memory 670. Those skilled in the art will readily recognize that other bus arrangements, such as a single bus performing the functions of buses 640 and 680, may be used which differ from the exemplary embodiment shown in FIG. 13 without departing from the scope of the claimed invention.

CONCLUSION

The following summarizes some, but not all, of the advantages of the disclosed digital RFI canceller which may be achieved by various embodiments of the present invention:

(1) Some embodiments of the present invention have very low computation complexity. For each tone (i.e., m) of interest, the factors needed in computing the RFI component (i.e., $W_m/(m-1/2)$ and $W_m/(m-1/2)^2$) are all data independent and can be pre-computed and stored in a lookup table. The cancellation only involves simple multiplication and addition.

(2) Some embodiments of the present invention offer much better performance than the prior art.

(3) The algorithm in some embodiments of the present invention is able to suppress RFI to a very low level when the envelope of RFI during the window span is either trapezoidal or arbitrary non-trapezoidal.

(4) Although the methods of some embodiments of the present invention yield poor results when |m| is extremely small, say 0 or 1, in real life it may not be a concern. Because the tones with extremely small |m| (i.e., very close to the center of RFI) are always in the amateur radio band (if this is the source of the RFI) instead of in the VDSL signal band, the poor performance for those tones is somewhat irrelevant.

(5) Two special cases are disclosed in detail as exemplary embodiments of this invention. The $2^{nd}$ order (K=2) method has very low computation complexity and yields nearly identical performance as the $3^{rd}$ order (K=3) method. Those skilled in the art can readily determine that higher orders, (i.e., K=4, K=5, are readily computed and utilizable with the present invention without departing from the scope of the claims.

Although specific embodiments have been illustrated and described herein, it will be appreciated by those of ordinary skill in the art that any arrangement which is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the invention includes any other implementations in which the above structures, apparatus, systems, method and computer-readable media are used.

What is claimed is:

1. A method of estimating a spectral component of interference at a particular frequency, comprising:
   selecting a frequency of interest from a first plurality of frequencies in a frequency band;
   generating the frequency domain data for the first plurality of frequencies;
   determining whether there is interference at any one of the first plurality of frequencies;
   determining the peak output of the frequency domain data at a location in the frequency band where the interference spectral components dominate;
   selecting the frequency domain data from a second plurality of frequencies near the spectral peak of the interference among the first plurality of frequencies;
   obtaining a first set of coefficients using linear combinations of the frequency domain data of the second plurality of frequencies using a second set of coefficients that are pre-computed and stored in a look-up table; and
   quantifying the interference component using an interface canceller at at the frequency of interest using a Taylor series on the reciprocal of the spectral distance between the frequency of interest and the spectral peak of the interference using the first set of coefficients, wherein the Taylor series estimates the spectral components of the interference generally in the form of $1/(m-½)$, where m is an integer and $(m-½)$ is a normalized approximate distance between a frequency of interest and the center frequency of the interference.

2. The method according to claim 1 further comprising generating the lookup table by pre-computing factors of coefficients of linear combinations for each of the second plurality of frequencies in the frequency band and storing the factors in the look-up table.

3. The method according to claim 2 further comprising determining the interference spectral components by determining the center frequency of the interference and determining the spectral distance between the frequency of interest and the center frequency of the interference.

4. The method according to claim 3 wherein the components of the first plurality of frequencies are orthogonal in the time span of interest.

5. The method according to claim 4 wherein the orthogonal frequencies have a tone spacing and the spectral distance is normalized to the tone spacing.

6. The method according to claim 1 wherein the first plurality of frequencies comprise multi-carrier modulated signal.

7. The method according to claim 6 wherein the multi-carrier modulated signal comprises a Very high speed Digital Subscriber Line (VDSL) signal.

8. The method according to claim 7 wherein the frequency band is a North American allocated VDSL frequency plan and the interference is radio frequency interference from amateur radio bands.

9. A method of estimating a spectral component of interference at a particular frequency, comprising:
   selecting a frequency of interest from a first plurality of frequencies in a frequency band;
   generating the frequency domain data for the first plurality of frequencies;
   determining the peak output of the frequency domain data at a location in the frequency band where radio frequency interference spectral components dominate;
   selecting the frequency domain data from a second plurality of frequencies near the spectral peak of the radio interference among the first plurality of frequencies;
   obtaining the interference component at the frequency of interest using a linear combination of the frequency domain data from the second plurality of frequencies using a set of pre-computed coefficients; and
   evaluating, using an interface canceller, the coupling between the frequency of interest and each of the second plurality of frequencies to obtain the set of pre-computed coefficients based on the relation that the spectral component of the interference at any frequency in the first plurality of frequencies can be expressed as a Taylor series of the reciprocal of the spectral distance between that frequency and the spectral peak of the interference, wherein the coefficients of the Taylor series are linear combinations of the frequency domain data of the second plurality of frequencies wherein the coefficients of the linear combinations are signal independent and can be pre-computed and stored.

10. The method according to claim 9 wherein obtaining the set of coefficients further comprises applying a pre-determined windowing constant to the interference component at the frequency of interest as an approximation of the effect of the time-domain windowing function on the frequency domain data.

11. The method according to claim 9 further comprising storing the set of pre-computed coefficients in a look-up table.

12. A system comprising:
   a receiver for receiving and processing analog signals;
   an analog-to-digital converter connected to the receiver to convert the analog signals into a first sequence of digital samples;
   a time-domain windowing function to select and process a portion of the first sequence of digital samples and generate a second sequence of digital samples;
   a discrete-time to discrete-frequency transformer connected to receive the second sequence of digital samples and to convert them into a set of frequency domain data; and
   an interference canceller connected to the discrete-time to discrete-frequency transformer to remove the interference contribution by computing the interference component at the frequency of interest by calculating a linear combination of the frequency domain data from a plurality of frequencies using a set of pre-computed coefficients; and
   wherein the interference canceller is configured to quantify the interference component at the frequency of interest using a Taylor series on the reciprocal of the spectral distance between the frequency of interest and the spectral peak of the interference using the first set of coefficients, the Taylor series estimates the spectral components of the interference generally in the form of $1/(m-½)$, where m is an integer and $(m-½)$ is a normalized approximate distance between a frequency of interest and the center frequency of the interference.

13. The system according to claim 12 wherein the time-domain windowing function selects a contiguous portion of the first sequence of digital samples and uses the selected samples as the second sequence of digital samples that are passed to the subsequent discrete-time to discrete-frequency transformer.

14. The system according to claim 12 wherein processing and selecting the first sequence of digital samples and generating the second sequence of digital samples comprise:
    selecting a contiguous portion of the first sequence of digital samples, resulting a third sequence of digital samples, where the number of the third sequence of samples exceeds that of the second sequence of samples;
    performing a sample-wise multiplication of the third sequence of digital samples with a fourth sequence of digital samples that are pre-defined and pre-computed and obtaining in a fifth sequence of digital samples; and
    obtaining the second sequence of digital samples by removing the first or last WE samples of the fifth sequence of digital samples and sample-wise adding their values to the last or first WE samples of the fifth sequence of digital samples, where WE is the difference between the number of the fifth sequence of digital samples and the number of the second sequence of digital sample.

15. The system according to claim 12 wherein the time-domain to frequency-domain transformer performs a discrete Fourier transform.

16. The system according to claim 12 wherein the interference canceller further comprises:
    a processor performing the operations of determining the frequency location of the peak of the interference and selecting a plurality of frequencies near the peak as representatives of the interference, and using the frequency domain data of the plurality of frequencies as a basis to form a linear combination to represent the interference at any frequency of interest.

17. The system according to claim 12 wherein the interference canceller is configured to obtain the set of coefficients by applying a pre-determined windowing constant to the interference component at the frequency of interest as an approximation of the effect of the time-domain windowing function on the frequency domain data.

18. The system according to claim 12, comprising a look-up table to store the set of pre-computed coefficients.

19. The system according to claim 12, wherein the analog signals include a multi-carrier modulated signal.

20. The system according to claim 19, wherein the multi-carrier modulated signal comprises a Very high-speed Digital Subscriber Line (VDSL) signal.

* * * * *

UNITED STATES PATENT AND TRADEMARK OFFICE
CERTIFICATE OF CORRECTION

| | | |
|---|---|---|
| PATENT NO. | : 7,542,531 B2 | Page 1 of 1 |
| APPLICATION NO. | : 11/196914 | |
| DATED | : June 2, 2009 | |
| INVENTOR(S) | : Chia-Liang Lin et al. | |

It is certified that error appears in the above-identified patent and that said Letters Patent is hereby corrected as shown below:

Title page, Item (57), under "Abstract", in column 2, line 10, delete "REI" and insert -- RFI --, therefor.

In column 17, line 39, in Claim 1, after "canceller at" delete "at".

In column 20, line 16, in Claim 17, delete "12" and insert -- 12, --, therefor.

Signed and Sealed this

Nineteenth Day of January, 2010

David J. Kappos
*Director of the United States Patent and Trademark Office*